(12) United States Patent
Niwa (10) Patent No.: US 6,559,518 B1
(45) Date of Patent: May 6, 2003

(54) MOS HETEROSTRUCTURE, SEMICONDUCTOR DEVICE WITH THE STRUCTURE, AND METHOD FOR FABRICATING THE SEMICONDUCTOR DEVICE

(75) Inventor: Masaaki Niwa, Osaka (JP)

(73) Assignee: Matsushita Electric Industrial Co., Ltd., Osaka (KP)

( * ) Notice: Subject to any disclaimer, the term of this patent is extended or adjusted under 35 U.S.C. 154(b) by 0 days.

(21) Appl. No.: 09/404,255

(22) Filed: Sep. 22, 1999

(30) Foreign Application Priority Data

Oct. 1, 1998 (JP) .............................. 10-279914

(51) Int. Cl.$^7$ .......................... H01L 23/58; H01L 29/06
(52) U.S. Cl. .................. 257/632; 257/401; 257/618; 257/623; 257/628; 438/287; 438/496; 438/502
(58) Field of Search .................... 257/627, 628, 257/401, 618, 623, 632–634; 438/287, 496, 502, 591

(56) References Cited

U.S. PATENT DOCUMENTS 5,350,938 A * 9/1994 Matsukawa et al. ........ 257/378
5,886,389 A * 3/1999 Niwa ........................ 257/401

FOREIGN PATENT DOCUMENTS

| JP | 53-62987 | 6/1978 |
|----|----------|--------|
| JP | 2-18934 | 1/1990 |
| JP | 4-297063 | 10/1992 |
| JP | 7-193254 | 7/1995 |
| JP | 9-51097 | 2/1997 |
| JP | 9-51097 A * | 2/1997 |
| JP | 409051097 A * | 2/1997 |
| JP | 9-102459 | 4/1997 |
| JP | 10-178170 | 6/1998 |
| JP | 11-176828 | 7/1999 |
| JP | 11-260939 | 9/1999 |

OTHER PUBLICATIONS

F. Rochet, et al., "Epitaxial Silica on Stepped Si(001) Surfaces" Solid–State Electronics, vol. 33, Supplement, pp. 135–141, 1990.

M. Niwa, "Atomic Scale Control of the $SiO_2$/Si Interfaces", pp. 1215–1219, 1997, Applied Physics, vol. 66, No. 11.

Y. Okuno et al., "Infrared Spectroscopy Study of the Si–$SiO_2$ Interface", pp. 541–543, Jul. 1996, Applied Physics Letter, vol. 69, No. 4.

* cited by examiner

Primary Examiner—Steven Loke
Assistant Examiner—Donghee Kang
(74) Attorney, Agent, or Firm—Nixon Peabody LLP; Donald R. Studebaker (57) ABSTRACT

An MOS heterostructure includes: a single crystal silicon substrate; an insulating film formed on the substrate; and a conductive film formed on the insulating film. The substrate includes a plurality of terraces and steps, which have been formed as a result of rearrangement of silicon atoms on the surface of the substrate. Each of the step is located in a boundary between an adjacent pair of the terraces. The insulating film contains crystalline silicon dioxide that has grown epitaxially over the steps.

4 Claims, 10 Drawing Sheets

MOS HETEROSTRUCTURE, SEMICONDUCTOR DEVICE WITH THE STRUCTURE, AND METHOD FOR FABRICATING THE SEMICONDUCTOR DEVICE

BACKGROUND OF THE INVENTION

The present invention relates to MOS heterostructure, semiconductor device with such a structure, and method for fabricating the semiconductor device.

An MOS field effect transistor (MOSFET) with a metalinsulator-semiconductor structure is well known in the art as a typical field effect transistor. The MOSFET is called as such because an oxide is regarded as a representative insulator of the structure. Thus, in this specification, such a structure including any of various types of insulators will be collectively called an "MOS heterostructure".

Hereinafter, a conventional method for fabricating an MOSFET will be described with reference to FIGS. 9($a$) through 9($d$).

First, as shown in FIG. 9($a$), an ordinary silicon substrate 50, i.e., a semiconductor substrate of single crystal silicon, is prepared. Then, as shown in FIG. 9($b$), a silicon oxide film 51 is formed thereon by thermally oxidizing the surface of the silicon substrate 50. The silicon oxide film 51 is mainly composed of amorphous silicon dioxide ($SiO_2$).

Figure 9A:
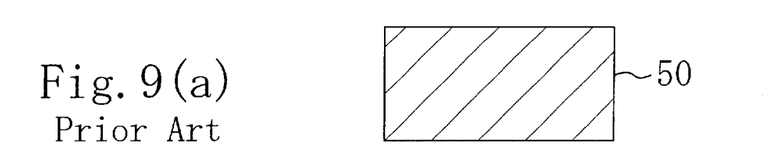
FIGS. 9(a) through 9(d) are cross-sectional views illustrating respective process steps for fabricating a conventional semiconductor device with an MOS heterostructure.
Figure 9B:
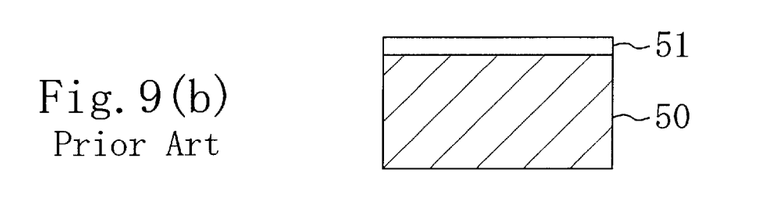
Figure 9C:
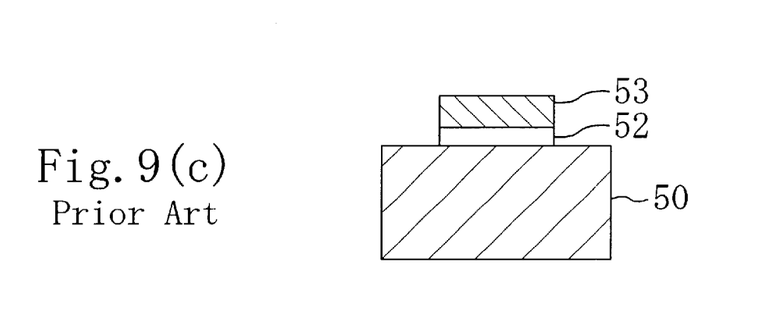
Figure 9D:
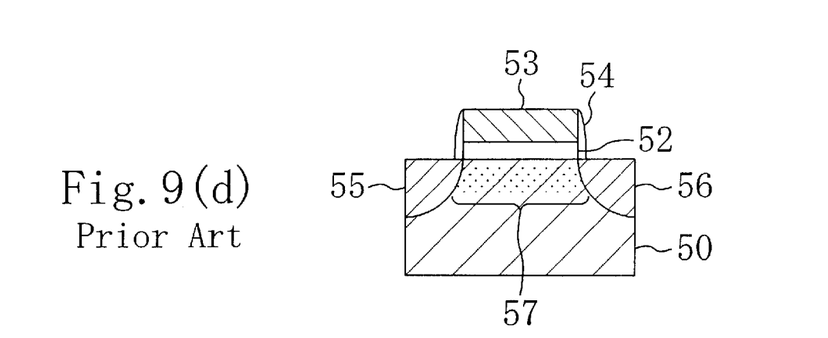

Next, a conductive thin film (not shown) such as a polysilicon film is deposited on the silicon oxide film 51. A resist pattern (not shown) is defined thereon to cover part of the conductive thin film in which a gate electrode should be formed. Then, the conductive thin film and silicon oxide film 51 are etched in this order using the resist pattern as a mask. In this manner, a gate insulating film 52 and a gate electrode 53 are formed out of the silicon oxide film 51 and conductive thin film, respectively, in this order on the silicon substrate 50 as shown in FIG. 9($c$).

Thereafter, as shown in FIG. 9($d$), a sidewall oxide film 54 is formed on the side faces of the gate electrode 53. And the silicon substrate 50 is doped with a dopant using the gate electrode 53 and sidewall oxide film 54 as a mask, thereby forming source/drain regions 55 and 56 in the substrate 50. In this case, when a predetermined voltage is applied between the silicon substrate 50 and gate electrode 53, a channel 57 is formed within a region of the silicon substrate 50 in the vicinity of the interface between the substrate 50 and gate insulating film 52.

In the conventional process, however, some strain is caused in the interface between the silicon substrate 50 and silicon oxide film 51 (hereinafter, called "silicon/thermal oxide interface") while the surface of the substrate 50 is being thermally oxidized to form the silicon oxide film 51 to be the gate insulating film 52 thereon. This is because the silicon oxide film 51 goes on expanding as the film 51 is growing on the surface of the silicon substrate 50. Accordingly, various structural defects are developed within the silicon substrate 50, thereby possibly creating interface states. These interface states in turn form carrier-trapping sites to cause the dielectric breakdown of the gate insulating film 52 or considerably decrease the mobility of carriers in the channel 57. As a result, the performance of the MOSFET deteriorates and therefore the transistor cannot operate at high speeds anymore.

Figure 10A:
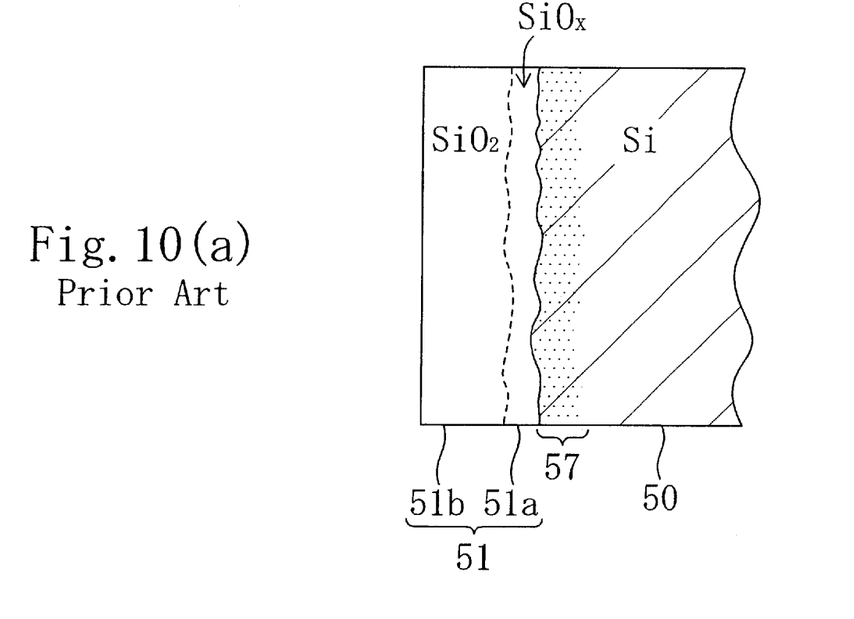
FIG. 10(a) illustrates a partial cross section of the conventional semiconductor device with the MOS heterostructure in the vicinity of a silicon/thermal oxide interface thereof.
Figure 10B:
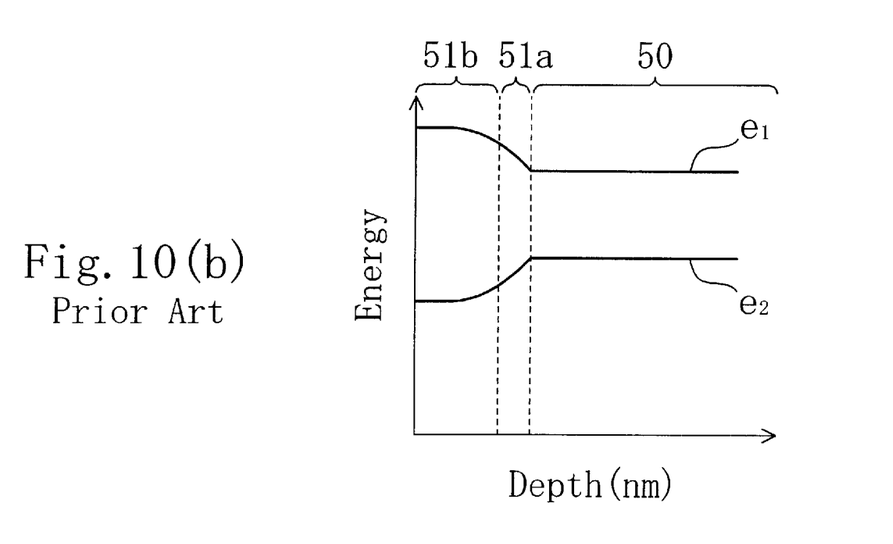
FIG. 10(b) illustrates respective energy levels of conduction and valence bands in the vicinity of the silicon/thermal oxide interface.

FIG. 10($a$) illustrates a schematic partial cross section of an MOSFET fabricated by the conventional method near the silicon/thermal oxide interface, while FIG. 10($b$) illustrates respective energy levels of the conduction and valence bands near the silicon/thermal oxide interface.

According to the conventional method for fabricating an MOSFET, while the silicon oxide film 51 is being formed within a surface region of the silicon substrate 50, part of the surface region is not oxidized completely. As a result, a structural transition layer 51$a$, which is a silicon suboxide ($SiO_x$, where $x \leq$ about 1.7) layer as thin as about 0.2 to about 0.3 nm, is formed as a part of the silicon oxide film 51 in the vicinity of the interface between the film 51 and silicon substrate 50 as shown in FIG. 10($a$). An ordinary amorphous $SiO_2$ layer 51$b$ with a thickness of several nanometers is formed on the structural transition layer 51$a$. The $SiO_x$ structural transition layer 51$a$ relaxes a strain caused between the Si substrate 50 and $SiO_2$ layer 51$b$. However, the chemical bonds in the structural transition layer 51$a$ are easily broken by electrons traveling in the channel 57. In other words, since the structural transition layer 51$a$ is easily broken by the intrusion of electrons, i.e., channel hot electrons, the structural transition layer 51$a$ is electrically unstable.

Also, as shown in FIG. 10($b$), the respective energy levels $e_1$ and $e_2$ at the conduction and valence bands are bent in a wide region, including the structural transition layer 51$a$, within the silicon oxide film 51, i.e., in the gate insulating film 52. Hereinafter, such a phenomenon will be called "bending". Because of this bending, the band gap of the silicon oxide film 51 considerably decreases vertically downward, i.e., toward the silicon/thermal oxide interface. As a result, the breakdown voltage and reliability of the silicon oxide film 51, i.e., the gate insulating film 52, both greatly decline.

In addition, the thinner that part of the silicon oxide film 51 to be the gate insulating film 52 (i.e., the $SiO_2$ layer 51$b$), the higher percentage of the silicon oxide film 51 the structural transition layer 51$a$ accounts for. Thus, the thicker the structural transition layer 51$a$ is getting, the more seriously the performance of the transistor is affected by the structural defects in the silicon/thermal oxide interface.

Specifically, the structural transition layer 51$a$ is about 0.2 to about 0.3 nm thick and that part of the silicon oxide film 51 with a decreased band gap is as thick as about 1 nm. Even if the thickness of the silicon oxide film 51 is reduced, however, the thickness of the structural transition layer 51$a$ remains almost the same. Accordingly, if the thickness of the silicon oxide film 51 is reduced, then the structural transition layer 51$a$ accounts for the increased percentage of the silicon oxide film 51. In addition, a larger proportion of the silicon oxide film 51 comes to have a smaller band gap. As a result, the silicon oxide film 51, i.e., the gate insulating film 52, has its breakdown voltage further decreased.

Furthermore, as the structural transition layer 51$a$ accounts for an increasing percentage of the silicon oxide film 51, then the thickness of the silicon oxide film 51 becomes non-uniform or the silicon/thermal oxide interface is roughened. In such a case, the electrons in the channel 57 travel along the silicon/thermal oxide interface while being affected by the roughened interface. As a result, the probability of electron scattering increases. Moreover, as a field effect transistor is downsized, the effective vertical field intensity, which is the intensity of an electric field vertical to the silicon/thermal oxide interface, rises, thus making the electron scattering phenomenon even more significant. Accordingly, if the gate insulating film 52 is thinned to downsize an MOSFET, then the mobility of electrons in the channel 57, or the transconductance, decreases, thereby interfering with the performance enhancement of the MOSFET.

SUMMARY OF THE INVENTION

A first, general object of the present invention is providing an MOS heterostructure with reduced structural defects in a semiconductor substrate.

A second, more specific object of the present invention is providing an MOS heterostructure where no structural transition layer exists within a region of an insulating film on a semiconductor substrate in the vicinity of the interface between the insulating film and the substrate.

To achieve the first object, an MOS heterostructure according to the present invention includes: a single crystal silicon substrate; an insulating film formed on the substrate; and a conductive film formed on the insulating film. The substrate includes a plurality of terraces and steps formed as a result of rearrangement of silicon atoms on the surface of the substrate. Each of the steps is located in a boundary between an adjacent pair of the terraces. The insulating film contains crystalline silicon dioxide that has grown epitaxially over the steps.

In the MOS heterostructure according to the present invention, the substrate includes a plurality of terraces and steps formed as a result of rearrangement of silicon atoms on the surface of the substrate. In addition, the insulating film contains crystalline silicon dioxide that has grown epitaxially over the steps. Accordingly, crystal lattice continuity is maintained in the interface between the single crystal silicon substrate and the crystalline silicon dioxide, and no great strain is created in the vicinity of the interface while the insulating film is being formed. Thus, substantially no structural defects are developed in the single crystal silicon substrate.

To achieve the second object, the crystalline silicon dioxide preferably forms a two-dimensionally-linked crystal film on the substrate in the MOS heterostructure of the present invention.

In such a case, no structural transition layer of suboxide is formed in a region of the crystal film, i.e., at least the lower part of the insulating film, in the vicinity of the interface between the crystal film and the substrate.

In the embodiment where the crystalline silicon dioxide forms the crystal film, the crystalline silicon dioxide preferably further grows epitaxially along the respective surfaces of the terraces to form the crystal film.

In such a case, a two-dimensionally-linked crystal film can be formed out of the crystalline silicon dioxide over the single crystal silicon substrate with more certainty.

In this particular embodiment, the thickness of the insulating film is preferably 4 nm or less.

In such a case, the overall insulating film may consist solely of the crystal film made of the crystalline silicon dioxide.

In an alternate embodiment, the insulating film preferably further includes a dielectric film formed on the crystal film.

In such a case, even if the crystal film is thin, the leakage current flowing from the single crystal silicon substrate can be reduced.

In this particular embodiment, a relative dielectric constant of the dielectric film is preferably higher than that of a silicon dioxide film.

In such a case, the leakage current flowing from the single crystal silicon substrate can still be reduced substantial without increasing the thickness of the insulating film.

In another embodiment of the present invention, an angle of misorientation against the surface of the substrate is preferably in the range from 1 to 30 degrees.

In such a case, the terraces and steps can be formed on the single crystal silicon substrate without creating the interface states in the substrate.

To achieve the first object, a semiconductor device according to the present invention includes: a single crystal silicon substrate; and a plurality of MOS transistors formed on the substrate. Each said MOS transistor includes: an insulating film formed on the substrate; a gate electrode formed on the insulating film; a channel region formed within the substrate; and source/drain regions electrically connected to the channel region. The substrate includes a plurality of terraces and steps formed as a result of rearrangement of silicon atoms on the surface of the substrate. Each of the steps is located in a boundary between an adjacent pair of the terraces. The insulating film contains crystalline silicon dioxide that has grown epitaxially over the steps.

In the semiconductor device according to the present invention, the substrate includes a plurality of terraces and steps formed as a result of rearrangement of silicon atoms on the surface of the substrate. In addition, the insulating film contains crystalline silicon dioxide that has grown epitaxially over the steps. Accordingly, crystal lattice continuity is maintained in the interface between the single crystal silicon substrate and the crystalline silicon dioxide, and no great strain is created in the vicinity of the interface while the insulating film is being formed. Thus, almost no structural defects are produced in the single crystal silicon substrate. Therefore, it is possible to substantially eliminate the interface states causing the dielectric breakdown of the insulating film and/or decreasing the mobility of carriers in the channel. As a result, the performance of the transistor can be enhanced and the operating speed thereof can be increased.

To achieve the second object, the crystalline silicon dioxide preferably forms a two-dimensionally-linked crystal film on the substrate in the semiconductor device of the present invention.

In such a case, no structural transition layer of suboxide is formed in a region of the crystal film, i.e., at least the lower part of the insulating film, in the vicinity of the interface between the crystal film and the substrate. Accordingly, chemical bonds in that region of the insulating film near the interface between the insulating film and the substrate are not broken by hot electrons. In addition, the decrease in band gap of the insulating film due to bending can also be avoided, thus increasing the breakdown voltage and reliability of the insulating film.

In the embodiment where the crystalline silicon dioxide forms the crystal film, the crystalline silicon dioxide preferably further grows epitaxially along the respective surfaces of the terraces to form the crystal film.

In such a case, a two-dimensionally-linked crystal film can be formed out of the crystalline silicon dioxide over the single crystal silicon substrate with more certainty.

In this particular embodiment, the steps preferably extend substantially in a channel longitudinal direction.

In such a case, carriers in the channel does not cross the steps, but travel from the source toward drain regions in the interface between the terraces, which can be regarded as being smooth at the atomic level, and the crystal film. As a result, a much smaller number of carriers are scattered at the interface. That is to say, the mobility of the carriers in the channel can be increased.

In an alternate embodiment, each said MOS transistor preferably further includes a control gate, which is capacitively coupled to the gate electrode, and preferably constitutes a nonvolatile memory cell in which the gate electrode functions as a floating gate. And the steps preferably extend to cross a channel longitudinal direction approximately at right angles.

In such a case, the carriers in the channel travel from the source toward drain regions while crossing the steps. Accordingly, hot electrons, which have been generated in the vicinity of the steps, can be injected into the floating gate more efficiently.

To achieve the first object, a method according to the present invention is adapted to fabricate a semiconductor device with an MOS heterostructure. The MOS heterostructure includes: a single crystal silicon substrate; an insulating film formed on the substrate; and a conductive film formed on the insulating film. The method includes the step of a) forming a plurality of terraces and steps on the surface of the substrate by rearranging silicon atoms. within the surface. Each of the steps is located in a boundary between an adjacent pair of the terraces. The method further includes the step of b) epitaxially growing crystalline silicon dioxide, which will form at least part of the insulating film, over the steps by thermally oxidizing the surface of the substrate while preventing the surface from being contaminated.

According to the method of the present invention, terraces and steps are formed on the surface of a single crystal silicon substrate by rearranging silicon atoms within the surface, and then crystalline silicon dioxide, which will form at least part of the insulating film, is epitaxially grown over the steps. Accordingly, crystal lattice continuity is maintained in the interface between the single crystal silicon substrate and the crystalline silicon dioxide, and no great strain is created in the vicinity of the interface during the formation of the insulating film. Thus, substantially no structural defects are developed in the single crystal silicon substrate.

To achieve the second object, the step b) preferably further includes forming a two-dimensionally-linked crystal film over the substrate by further growing epitaxially the crystalline silicon dioxide along respective surfaces of the terraces.

In such a case, no structural transition layer of suboxide is formed in a region of the crystal film, i.e., at least the lower part of the insulating film, in the vicinity of the interface between the crystal film and the substrate.

In the embodiment where the step b) includes forming the crystal film, the step b) preferably further includes thermally oxidizing the surface such that the thickness of the insulating film is equal to or smaller than 4 nm.

In such a case, the overall insulating film may consist solely of the crystal film made of the crystalline silicon dioxide.

In an alternate embodiment, the method preferably further includes the step of depositing a dielectric film, which has a relative dielectric constant higher than that of a silicon dioxide film, on the crystal film after the step b) has been performed.

In such a case, the leakage current flowing from the single crystal silicon substrate can still be reduced substantial without increasing the thickness of the insulating film.

DESCRIPTION OF THE PREFERRED EMBODIMENTS

Embodiment 1

Hereinafter, MOS heterostructure, semiconductor device with the structure and method for fabricating the device according to a first embodiment of the present invention will be described with reference to the accompanying drawings. A semiconductor device with an MOS heterostructure according to the first embodiment includes MOSFETs formed by using a single crystal silicon substrate. This semiconductor device further includes additional circuit components such as interconnection and isolation structures just like any other semiconductor device known. It should be noted, however, that only the MOS heterostructure of the transistor is illustrated in the corresponding drawings for the sake of simplicity.

FIGS. 1(a) through 1(d) are cross-sectional views illustrating respective process steps for fabricating a semiconductor device with an MOS heterostructure according to the first embodiment.

Figure 1A:
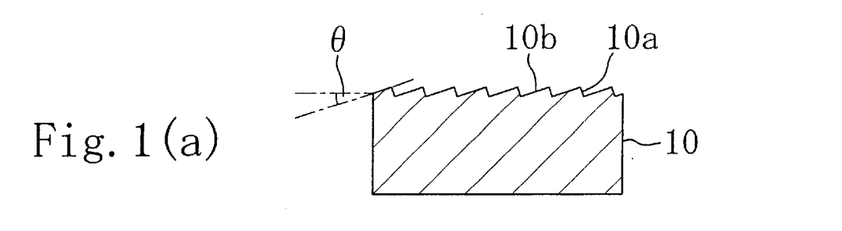
FIGS. 1(a) through 1(d) are cross-sectional views illustrating respective process steps for fabricating a semiconductor device with an MOS heterostructure according to a first embodiment of the present invention.

First, as shown in FIG. 1(a), a (001) clean surface is prepared by heating and cleaning a (001) crystallographic plane of a single crystal silicon substrate 10 (hereinafter, simply referred to as a "silicon substrate 10") within vacuum or by homoepitaxy of silicon. As for the process step of preparing the (001) clean surface by heat cleaning, see Japanese Laid-Open Publication No. 9-51097, which is hereby incorporated by reference.

Specifically, the silicon substrate 10 is a misorientation substrate, and a misorientation angle θ defined between the principal surface thereof and the (001) planes may be 5 degrees, for example. If the surface of the silicon substrate 10, which is a misorientation substrate, is treated by the heat cleaning within vacuum or by the homoepitaxy of silicon, then silicon atoms are going to be rearranged on the outermost cleaned surface of the silicon substrate 10. As a result, a plurality of steps 10a and terraces 10b are formed on the surface of the silicon substrate 10 as shown in FIG. 1(a). The surface does not have to be treated by the heat cleaning within vacuum or homoepitaxy of silicon, but by hot water cleaning, treatment with buffered hydrofluoric acid mixed with hydrogen peroxide, improved SC-1 cleaning with the concentration of hydrogen peroxide increased or wet treatment with diluted hydrofluoric acid.

On the surface of the silicon substrate 10, each step 10a is located in the boundary between an associated pair of adjacent terraces 10b. In other words, each terrace 10b at a relatively high level (hereinafter, referred to as an "upper terrace") is adjacent to another terrace 10b at a relatively low level (hereinafter, referred to as an "lower terrace") with an associated step 10a interposed therebetween. Also, these steps 10a and terraces 10b extend in the [11−0] direction (in this specification, a Miller index followed by a negative sign is supposed to represent a negative direction index for convenience sake). The respective upper surfaces of these terraces 10b are (001) planes, which are microscopically smooth (i.e., at an atomic level). And the height of each step 10a is approximately equal to the thickness of two atomic layers of silicon atoms.

The surface topology of the silicon substrate 10 with these steps 10a and terraces 10b formed thereon may be represented as: Si(001)−2×1. On the surface of the silicon substrate 10 with such a topology, the greater the misorientation angle θ of the silicon substrate 10, the higher the density of the steps 10a. For example, if a silicon substrate 10 with a misorientation angle of 5 degrees is heated and cleaned at about 1000° C. for about 10 to about 20 seconds within vacuum, then the distance between adjacent steps 10a, i.e., the width of each terrace 10b, is about 3 nm.

On the outermost surface of each terrace 10b, the silicon atoms together make an atomic arrangement of dimers (hereinafter, referred to as a "dimer arrangement"). If the misorientation angle θ is relatively small, then the direction in which dimers are arranged on a terrace 10b is orthogonal to the direction in which dimers are arranged on another terrace 10b adjacent to the former terrace 10b. In contrast, if the misorientation angle θ is relatively large as in this embodiment, then the dimers are arranged in the same direction on all of these terraces 10b.

Next, the surface of the silicon substrate 10 with the Si(001)−2×1 topology is thermally oxidized. Specifically, the silicon substrate 10 is heated up to about 800° C. and exposed to dried oxygen gas at a partial pressure of 10 Torr for about 60 minutes. During this process, approximately $10^{16}$ oxygen atoms per square centimeter are supplied onto the surface of the silicon substrate 10. The dried oxygen gas used for this thermal oxidation may be produced in the following manner. First, oxygen gas is purified using a purifier to obtain 100% purity oxygen gas and then the high-purity oxygen gas is passed through liquid nitrogen to remove sufficient moisture therefrom.

Figure 1B:
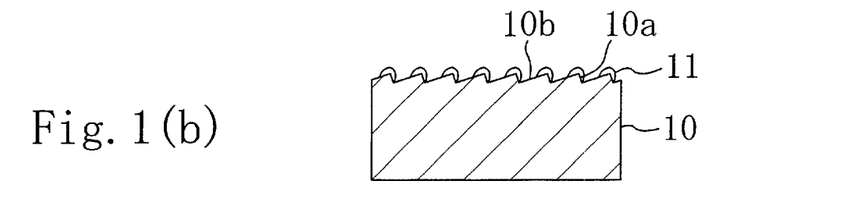

During the initial stage of the thermal oxidation, a crystalline oxide 11, more specifically, crystalline silicon dioxide, grows epitaxially over the steps 10a as shown in FIG. 1(b). The crystalline oxide 11 has a crystal structure corresponding to that of the steps 10a. On the other hand, the crystalline oxide 11 does not grow epitaxially out of the terraces 10b themselves. However, the crystalline oxide 11, which has been formed over the steps 10a, further grows epitaxially along the respective surfaces of the terraces 10b. As a result, part of each terrace 10b (i.e., both the higher- and lower terraces 10b alike) in the vicinity of the nearest step 10a is also covered with the crystalline oxide 11.

Figure 1C:
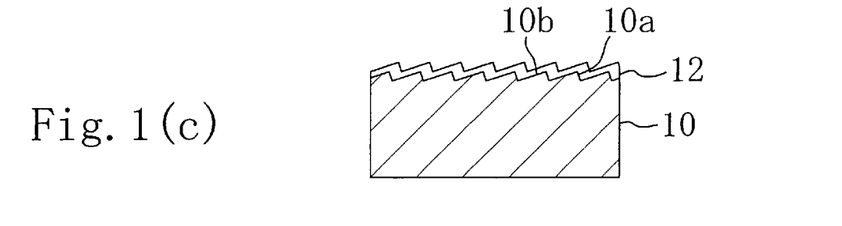

Accordingly, if the distance between adjacent steps 10a is reduced by increasing the misorientation angle θ, then the crystalline oxide 11 formed on a step 10a can be linked to the crystalline oxide 11 formed on an adjacent step 10a. Specifically, when the misorientation angle θ is 5 degrees or more, for example, then the step gap is 3 nm or less. In such a case, the crystalline oxides 11 formed on an adjacent pair of steps 10a are linked together to form a two-dimensionally-linked crystalline oxide film 12 over the silicon substrate 10 to a thickness of about 1 to about 2 nm as shown in FIG. 1(c). However, the greater the misorientation angle θ, the more likely the interface states are created within the silicon substrate 10. Thus, the misorientation angle θ of the silicon substrate 10 suitable for forming the crystalline oxide film 12 is in the range from about 1 to about 30 degrees. The thickness of the crystalline oxide film 12 is determined depending on the temperature of the substrate or the partial pressure of oxygen during the epitaxy. However, on and after the thickness of the crystalline oxide film 12 reaches about 4 nm, the deposition rate thereof decreases abruptly. Accordingly, this thermal oxidation technique is suitable for forming a gate insulating film with a thickness of about 4 nm with good reproducibility.

In general, when an amorphous silicon dioxide ($SiO_2$) film is formed by normal thermal oxidation on a silicon (Si) substrate, the part of the Si substrate to be oxidized to be $SiO_2$ increases its volume by a factor of about 2.2. Accordingly, a tensile strain is created in a region of the silicon substrate in the vicinity of the interface between the substrate and silicon dioxide film. On the other hand, a compressive strain is created in a region of the silicon dioxide film in the vicinity of the interface between the film and substrate. In contrast, if the crystalline oxide film 12 is formed over the silicon substrate 10 by the thermal oxidation process of the present invention, then the volume of the crystalline oxide film 12 increases by a very small factor and the strain within the crystalline oxide film 12 maintains a good balance. This is because the crystalline oxide film 12 grows epitaxially in accordance with the atomic structure of the silicon substrate 10. Accordingly, crystal lattice continuity is maintained in the interface between the silicon substrate 10 and the crystalline oxide film 12, thus creating no great strain even in the vicinity of the interface. As a result, almost no structural defects, such as stacking faults or twin crystals, are developed within the silicon substrate 10. Thus, according to the present invention, there is no need to conduct any annealing usually required after the crystalline oxide film 12 has been formed.

The present inventors analyzed the cross section of the crystalline oxide film 12 by transmission electron microscopy and electron beam diffraction. As a result, we believe the crystalline oxide film 12 has a β cristobalite structure, more particularly, a pseudo-β cristobalite structure with the smallest stress or strain. In silicon dioxide with the pseudo-β cristobalite structure, the Si—O bond length is in the range from 0.161 nm to 0.167 nm and the O—Si—O bond angle is in the range from 95 to 130 degrees.

If the misorientation angle θ is decreased, however, the distance between adjacent steps 10a becomes longer, and the crystalline oxide 11 formed over the adjacent steps 10a are isolated from each other as a result. For example, suppose an ordinary silicon substrate with a misorientation angle of zero degrees is thermally oxidized in the above-described manner. In such a case, a crystalline oxide grows to a thickness of about 4 nm over some parts of the silicon substrate during the initial stage of the thermal oxidation. As the thermal oxidation advances, however, an amorphous oxide gradually grows to form an amorphous oxide film with a plurality of isolated crystalline oxides formed in the lower part thereof. Accordingly, a crystal-amorphous structure is substantially formed in the interface between the silicon substrate and the oxide film, and the silicon substrate is likely to be affected by the strain resulting from the thermal expansion of the oxide film. As a result, structural defects are produced within the silicon substrate.

Figure 1D:
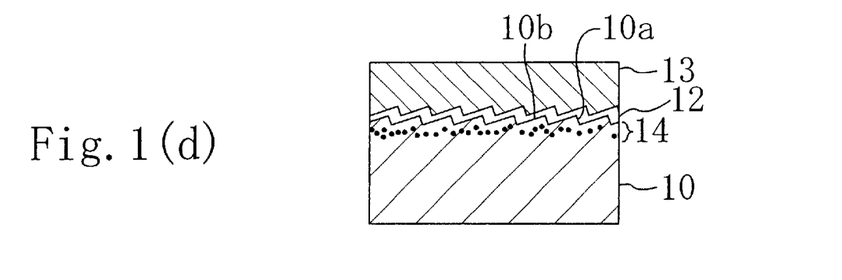

Next, a polysilicon film (not shown) is deposited by a CVD process, for example, on the crystalline oxide film 12. Then, the polysilicon film and the crystalline oxide film 12 are etched in this order using a resist pattern (not shown), which has been defined to cover respective regions of the polysilicon film where gate electrodes are to be formed. In this manner, a gate insulating film and a gate electrode 13 are formed on the silicon substrate 10 out of the crystalline oxide film 12 and the polysilicon film, respectively. Thereafter, the same process steps as the counterparts of an ordinary MOS transistor fabrication process are performed to complete a semiconductor device. In this case, if a predetermined voltage is applied between the silicon substrate 10 and gate electrode 13, then a channel 14 is formed in a region of the silicon substrate 10 near the interface between the gate insulating film, i.e., the crystalline oxide film 12, and the substrate 10 as shown in FIG. 1(d).

Figure 2:
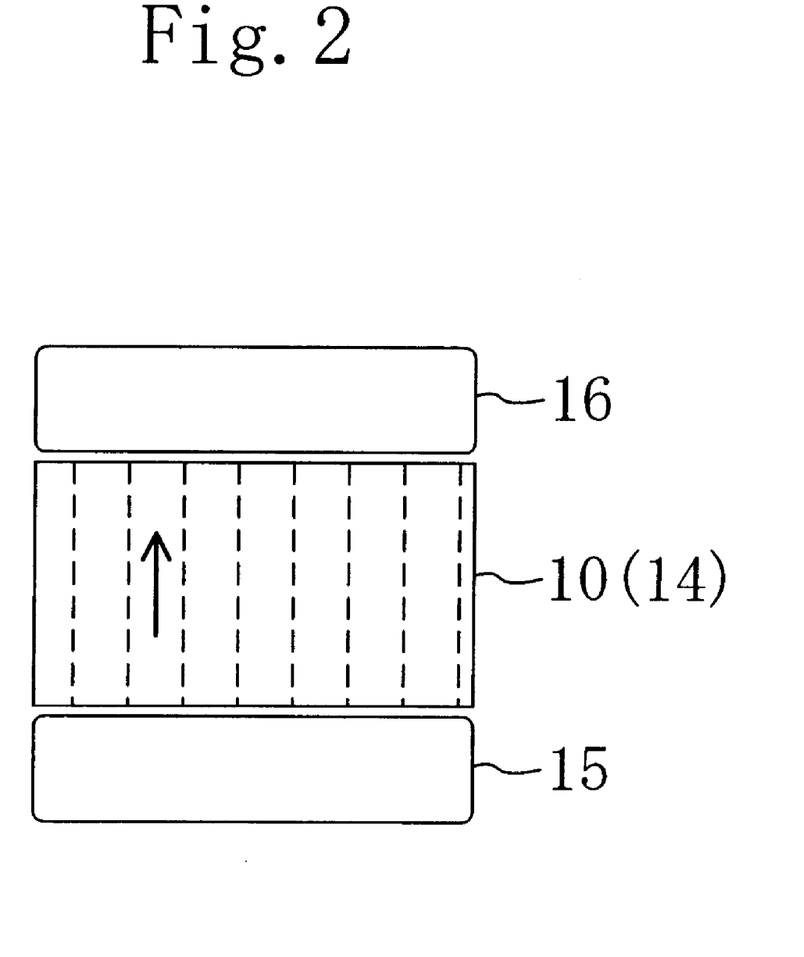
FIG. 2 is a plan view of the semiconductor device with the MOS heterostructure according to the first embodiment.

FIG. 2 illustrates a planar layout of a semiconductor device with the MOS heterostructure, more specifically, an MOSFET, according to the first embodiment. In FIG. 2, the illustration of the gate insulating film, i.e., the crystalline oxide film 12, and the gate electrode 13 is omitted. Also, the broken lines shown in FIG. 2 indicate the direction in which the steps 10a formed on the surface of the silicon substrate 10 extend. In other words, a region interposed between a pair of adjacent broken lines in FIG. 2 corresponds to a terrace 10b on the surface of the silicon substrate 10. It should be noted that the respective shapes of the steps 10a and terraces 10b remain the same even after the crystalline oxide film 12 has been formed.

As shown in FIG. 2, source/drain regions 15 and 16 are defined at such regions within the silicon substrate 10 that the steps 10a extend in the channel longitudinal direction. And these regions have been doped with a dopant. Accordingly, carriers (i.e., electrons) in the channel 14 travel from the source toward drain regions 15 to 16 (i.e., in the direction indicated by the arrow in FIG. 2) in the interface between the terraces 15b, which are smooth on an atomic level, and the crystalline oxide film 12 without crossing the steps 10a. Thus, a much smaller number of carriers are scattered by the interface, and therefore, the mobility of carriers within the channel 14 increases. In this case, the greater the misorientation angle θ (i.e., as the height of each step 10a increases), the higher the mobility of carriers within the channel 14.

In the MOS heterostructure according to the first embodiment, the steps 10a and terraces 10b are formed on the surface of the silicon substrate 10 (i.e., a single crystal silicon substrate) as a result of rearrangement of silicon atoms on the surface of the substrate. In addition, an insulating film (i.e., the crystalline oxide film 12) made of crystalline silicon dioxide (i.e., the crystalline oxide 11) that has grown epitaxially over the steps 10a is also formed over the silicon substrate 10. Accordingly, crystal lattice continuity is maintained in the interface between the silicon substrate 10 and the insulating film, and no great strain is created in the vicinity of the interface while the insulating film is being formed. Thus, almost no structural defects are developed within the silicon substrate 10. Therefore, in the MOSFET with the MOS heterostructure according to the first embodiment, the interface states, which cause the dielectric breakdown of the crystalline oxide film 12 to be the gate insulating film and/or decrease the mobility of carriers in the channel 14, can be substantially eliminated from the silicon substrate 10. As a result, the performance of the transistor can be enhanced and the operating speed thereof can be increased.

Figure 3A:
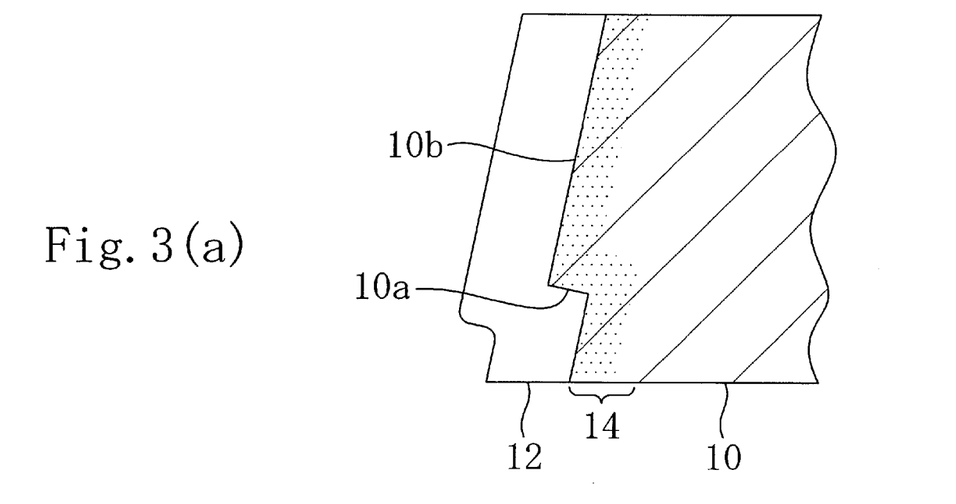
FIG. 3(a) illustrates a partial cross section of the semiconductor device with the MOS heterostructure according to the first embodiment in the vicinity of an interface between a silicon substrate and a crystalline oxide film.
Figure 3B:
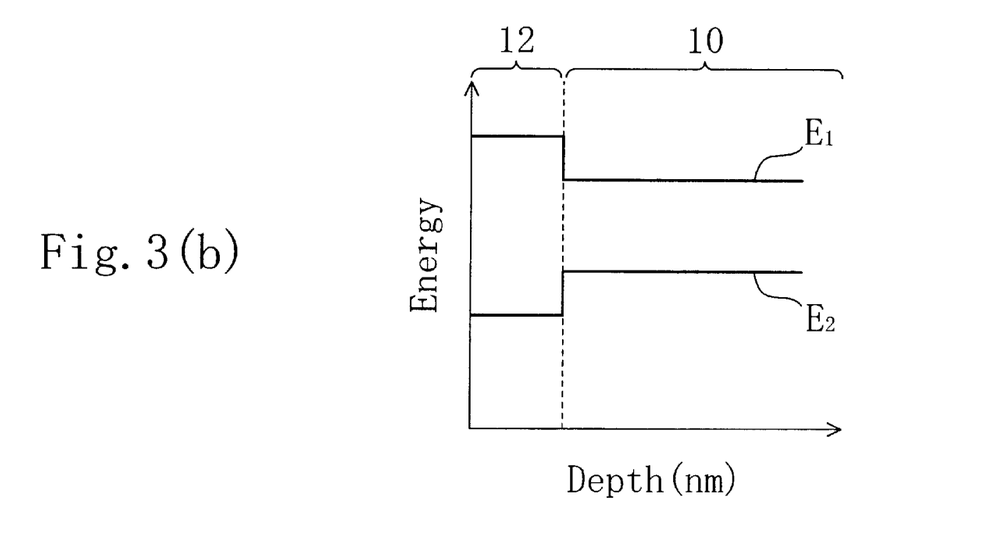
FIG. 3(b) illustrates respective energy levels of conduction and valence bands in the vicinity of the interface.

FIG. 3(a) illustrates a partial cross section of the semiconductor device with the MOS heterostructure, more particularly, the MOSFET, according to the first embodiment in the vicinity of an interface between the silicon substrate 10 and crystalline oxide film 12. FIG. 3(b) illustrates respective energy levels of conduction and valence bands in the vicinity of the interface.

As shown in FIG. 3(a), no structural transition layer of suboxide (see FIG. 10(a)) exists in a region of the crystalline oxide film 12, which will be a gate insulating film, in the vicinity of the interface between the film 12 and the silicon substrate 10. Thus, the chemical bonds in that region of the gate insulating film in the vicinity of the interface between the film and the silicon substrate 10 are not broken by hot electrons. Also, even if the crystalline oxide film 12, i.e., the gate insulating film, is thinned, the thickness of the gate insulating film does not get non-uniform or the interface between the gate insulating film and the silicon substrate 10 is not roughened, either. This is because no structural transition layer exists in that region.

Also, as shown in FIG. 3(a), the interface between the silicon substrate 10 and the crystalline oxide film 12 has a crystal-crystal structure, not the crystal-amorphous structure as is often found in conventional semiconductor devices. Accordingly, carriers in the channel 14 are not subjected to random potential scattering at a discontinuous surface unlike the conventional semiconductor device. Moreover, generally speaking, heat may cause a transition from an amorphous phase into a crystalline one, but cannot cause any transition from a crystalline phase into an amorphous one. Thus, the crystal-crystal structure in the interface between the silicon substrate 10 and the crystalline oxide film 12 shown in FIG. 3 is thermally stable.

Furthermore, as shown in FIG. 3(b), the respective energy levels $E_1$ and $E_2$ of the conduction and valence bands are flat within the crystalline oxide film 12, i.e., the gate insulating film. Accordingly, the decrease in band gap of the gate insulating film due to the bending phenomenon can be suppressed, thus increasing the breakdown voltage and reliability of the gate insulating film.

In the MOS heterostructure according to the first embodiment, the thickness of the insulating film formed on the silicon substrate 10 is preferably 4 nm or less. In such a case, the overall insulating film may consist solely of the crystalline oxide film 12, i.e., a crystalline silicon dioxide layer. Accordingly, the reliability of the MOSFET can be enhanced even when the thickness of the gate insulating film is considerably reduced, for example.

In the MOSFET with the MOS heterostructure according to the first embodiment, the gate insulating film consists solely of the crystalline oxide film 12 with a thickness of 4 nm or less. Alternatively, the gate insulating film may consist of a crystalline oxide film with a thickness of 4 nm or less and an amorphous silicon dioxide layer formed on the crystalline oxide film. Even in such an embodiment, no structural transition layer exists in that region of the gate insulating film in the vicinity of the interface between the film and the silicon substrate, either. Accordingly, the conduction and valence bands can also show such energy levels, or band gap, as those shown in FIG. 3(b), and the breakdown voltage and reliability of the gate insulating film can also be increased. As a result, the performance of the transistor is improved.

The growth of the crystalline oxide film 12 can be observed by reflection high-energy electron diffraction (RHEED). Specifically, by irradiating the surface of the silicon substrate 10 with electron beams at a very small angle during the thermal oxidation, or exposure to oxygen, a surface crystal structure pattern, changing with the growth of the crystalline oxide film 12, can be obtained based on the diffraction images of totally reflected electrons.

Figure 4A:
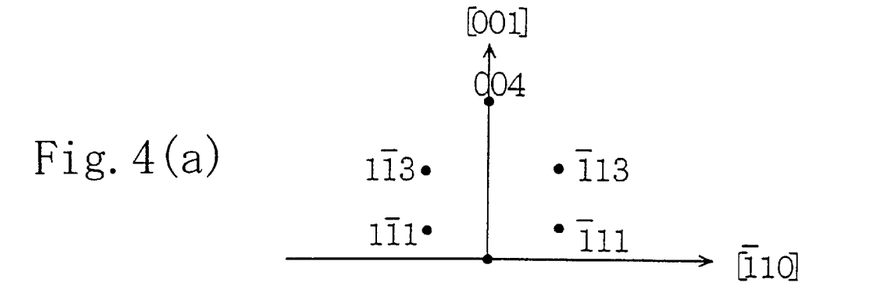
FIGS. 4(a) through 4(c) illustrate the interface of an MOS heterostructure, which is being formed by the method according to the first embodiment of the present invention and analyzed by RHEED.
Figure 4B:
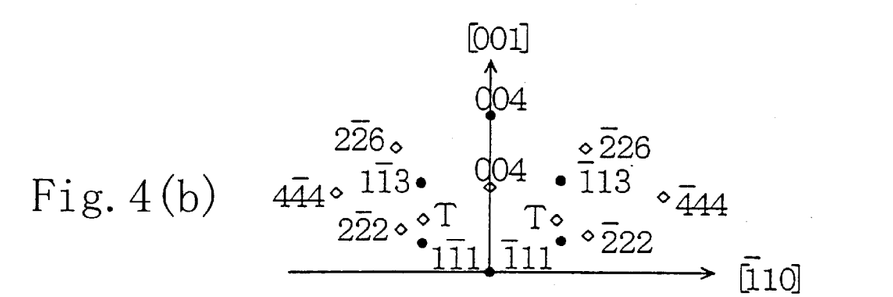
Figure 4C:
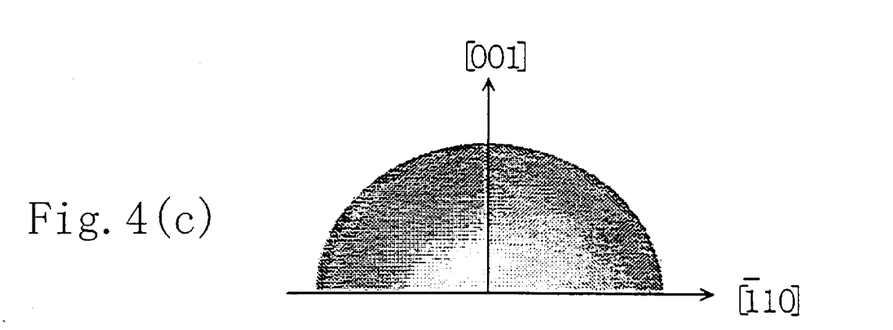

FIGS. 4(a) through 4(c) illustrate the RHEED patterns (images) obtained by observing the surface of the silicon substrate 10 in the [110] direction. FIGS. 4(a) through 4(c) show RHEED images, corresponding to a structure in which various microscopic slopes exist on the surface of the silicon substrate 10 with a large misorientation angle θ. Actually, a RHEED image for such a microscopic slope is represented as an arrow streak. In FIGS. 4(a) through 4(c), however, those inclined RHEED images are also illustrated as spots for the sake of simplicity.

FIG. 4(a) illustrates a RHEED image before the crystalline oxide 11 is produced on the silicon substrate 10. In FIG. 4(a), the solid circles represent diffraction points like (004), (113) and (111).

FIG. 4(b) illustrates another RHEED image after the crystalline oxide 11 has been produced on the silicon substrate 10 by exposing the surface of the substrate 10 to oxygen. In FIG. 4(b), the open diamonds represent diffraction points like (444), (226) and (222) corresponding to the crystalline oxide 11 grown on the surface of the silicon substrate 10.

FIG. 4(c) illustrates still another RHEED image after the crystalline oxide film 12 and an amorphous silicon dioxide layer have been formed in this order on the silicon substrate 10 as a result of the oxidation continued. In FIG. 4(c), all the diffraction points, or spots, shown in FIGS. 4(a) and 4(b), which correspond to the crystalline phases, have disappeared and a halo has appears instead.

As described above, by observing the surface of the silicon substrate 10 by RHEED during the thermal oxidation, the structural changes happening on the surface of the silicon substrate 10 can be known in real time.

Embodiment 2

Hereinafter, MOS heterostructure, semiconductor device with the structure and method for fabricating the device according to a second embodiment of the present invention will be described with reference to the accompanying drawings. A semiconductor device with an MOS heterostructure according to the second embodiment includes MOSFETs formed by using a single crystal silicon substrate. This semiconductor device further includes additional circuit components such as interconnection and isolation structures just like any other semiconductor device known. It should be noted, however, that only the MOS heterostructure of the transistor is illustrated in the corresponding drawings for the sake of simplicity.

FIGS. 5(a) through 5(e) are cross-sectional views illustrating respective process steps for fabricating a semiconductor device with an MOS heterostructure according to the second embodiment.

Figure 5A:
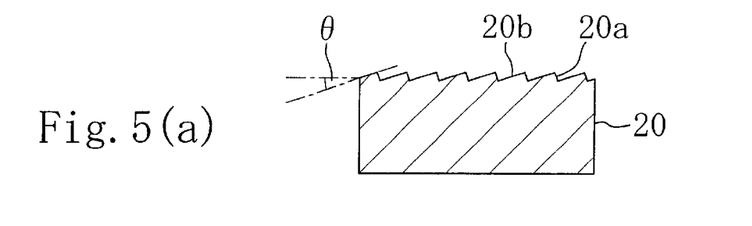
FIGS. 5(a) through 5(e) are cross-sectional views illustrating respective process steps for fabricating a semiconductor device with an MOS heterostructure according to a second embodiment of the present invention.

First, as shown in FIG. 5(a), a (001) clean surface is prepared by heating and cleaning a (001) crystallographic plane of a single crystal silicon substrate 20 (hereinafter, simply referred to as a "silicon substrate 20") within vacuum or by homoepitaxy of silicon.

Specifically, the silicon substrate 20 is a misorientation substrate, and a misorientation angle θ defined between the principal surface thereof and the (001) planes may be 5 degrees, for example. If the surface of the silicon substrate 20, which is a misorientation substrate, is treated by the heat cleaning within vacuum or by the homoepitaxy of silicon, then silicon atoms are going to be rearranged on the outermost cleaned surface of the silicon substrate 20 as in the first embodiment. As a result, a plurality of steps 20a and terraces 20b are formed on the surface of the silicon substrate 20 as shown in FIG. 5(a).

Next, the surface of the silicon substrate 20 with the Si(001)–2×1 topology is thermally oxidized. Specifically, the silicon substrate 20 is heated up to about 800° C. within an electric furnace and exposed to dried oxygen gas at a partial pressure of 10 Torr for about 60 minutes. The dried oxygen gas used for this thermal oxidation may be produced in the following manner. First, oxygen gas is purified using a purifier to obtain 100% purity oxygen gas and then the high-purity oxygen gas is passed through liquid nitrogen to remove sufficient moisture therefrom.

Figure 5B:
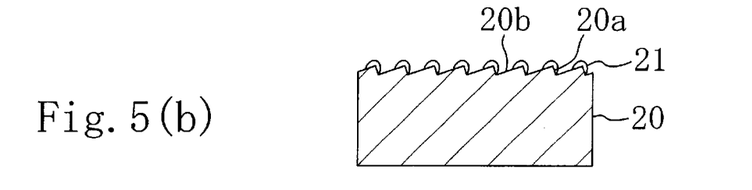

During the initial stage of the thermal oxidation, a crystalline oxide 21, more specifically, crystalline silicon dioxide, grows epitaxially over the steps 20a as shown in FIG. 5(b). The crystalline oxide 21 has a crystal structure corresponding to that of the steps 20a. On the other hand, the crystalline oxide 21 does not grow epitaxially out of the terraces 20b themselves. However, the crystalline oxide 21, which has been formed over the steps 20a, further grows epitaxially along the respective surfaces of the terraces 20b. As a result, part of each terrace 20b (i.e., both the higher- and lower terraces 20b alike) in the vicinity of the nearest step 20a is also covered with the crystalline oxide 21.

Figure 5C:
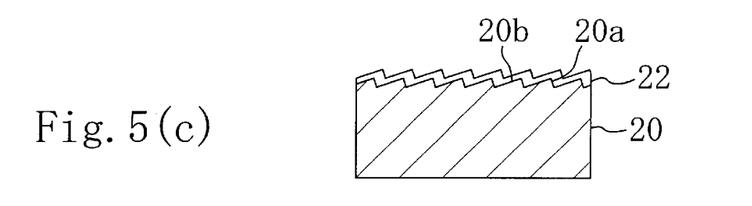

If the misorientation angle θ is 5 degrees as in this embodiment, then the step gap becomes about 3 nm. Accordingly, as the thermal oxidation advances, the crystalline oxides 21 formed on an adjacent pair of steps 20a are linked together, thereby forming a two-dimensionally-linked crystaline oxide film 22 over the silicon substrate 20 to a thickness of about 1 to about 2 nm as shown in FIG. 5(c).

Figure 5D:
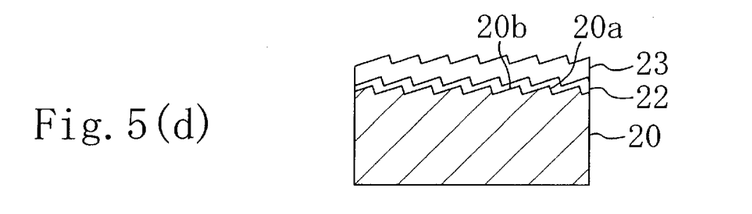

Then, as shown in FIG. 5(d), a tantalum oxide film 23, for example, is deposited on the crystalline oxide film 22. The relative dielectric constant of the tantalum oxide film 23 is about six times as high as that of the crystalline oxide film 22, i.e., silicon dioxide film ($SiO_2$ film). Accordingly, even if a relatively thick tantalum oxide film 23 is formed, the tantalum oxide film 23 is equivalent to a silicon dioxide film with a thickness about one-sixth as large as the actual thickness of the tantalum oxide film 23. Thus, if the tantalum oxide film 23 is additionally provided, then the gate leakage current can be drastically reduced substantially without increasing the thickness of the gate insulating film. In particular, the crystalline oxide film 22, which will be the lower layer of the gate insulating film, is very thin according to this embodiment. Thus, the tantalum oxide film 23 is preferably provided, because the gate leakage current might increase otherwise.

Specifically, the silicon substrate 20 with the crystalline oxide film 22 formed thereon is heated up to about 410° C. and kept in a steady state. Thereafter, the tantalum oxide film 23 is deposited to be 15 nm thick on the crystalline oxide film 22 by a CVD process using a mixed gas of $Ta(OC_2H_5)_5$ and $O_2$. Then, the tantalum oxide film 23 is annealed at 800° C. for about one minute within an inert gas ambient.

Figure 5E:
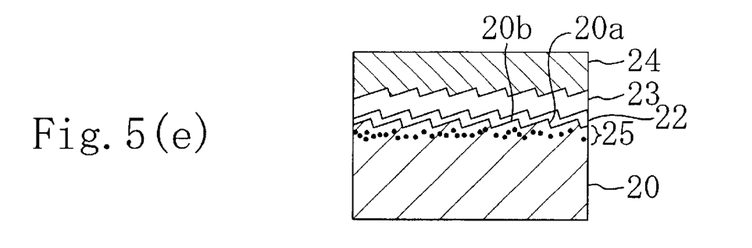

Next, a polysilicon film (not shown) is deposited by an LPCVD process, for example, on the tantalum oxide film 23. Then, the polysilicon film, tantalum oxide film 23 and crystalline oxide film 22 are etched in this order using a resist pattern (not shown), which has been defined to cover respective regions of the polysilicon film where gate electrodes are to be formed. In this manner, a gate electrode 24 is formed over the silicon substrate 20 with a gate insulating film, consisting of the crystalline oxide film 22 and tantalum oxide film 23, interposed therebetween. Thereafter, the same process steps as those of an ordinary MOS transistor fabrication process are performed to complete a semiconductor device. In this case, if a predetermined voltage is applied between the silicon substrate 20 and gate electrode 24, then a channel 25 is formed in a region of the substrate 20 near the interface between the lower layer of the gate insulating film, i.e., the crystalline oxide film 22, and the substrate 20 as shown in FIG. 5(e).

Figure 6:
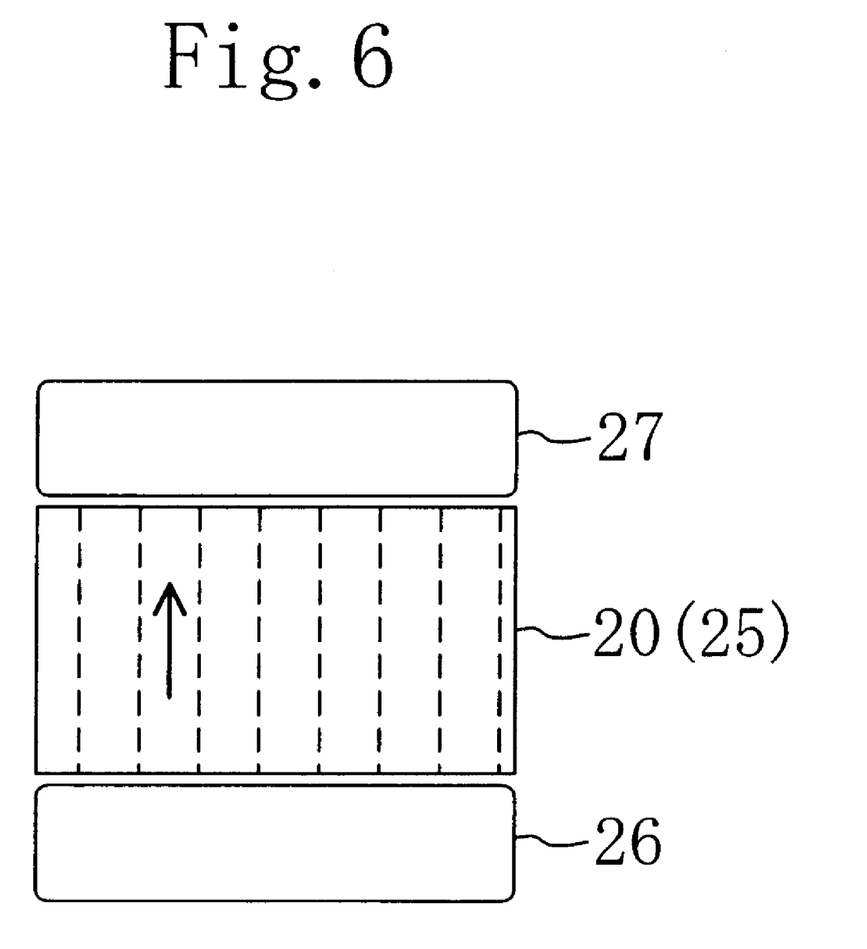
FIG. 6 is a plan view of the semiconductor device with the MOS heterostructure according to the second embodiment.

FIG. 6 illustrates a planar layout of a semiconductor device with the MOS heterostructure, more specifically an MOSFET, according to the second embodiment. In FIG. 6, the illustration of the gate insulating film, consisting of the crystalline oxide film 22 and tantalum oxide film 23, and the gate electrode 24 is omitted. Also, the broken lines shown in FIG. 6 indicate the direction in which the steps 20a formed on the surface of the silicon substrate 20 extend. In other words, a region interposed between a pair of adjacent broken lines in FIG. 6 corresponds to a terrace 20b on the surface of the silicon substrate 20. It should be noted that the shapes of the steps 20a and terraces 20b remain the same even after the crystalline oxide film 22 has been formed.

As shown in FIG. 6, source/drain regions 26 and 27 are defined at such regions within the silicon substrate 20 that the steps 20a extend in the channel longitudinal direction. And these regions have been doped with a dopant. Accordingly, carriers (i.e., electrons) in the channel 25 travel from the source toward drain regions 26 to 27 (i.e., in the direction indicated by the arrow in FIG. 6) in the interface between the terraces 20b, which can be regarded as smooth on an atomic level, and the crystalline oxide film 22 without crossing the steps 20a. Thus, a much smaller number of carriers are scattered by the interface, and therefore, the mobility of carriers within the channel 25 increases.

In the MOS heterostructure according to the second embodiment, the steps 20a and terraces 20b are formed on the surface of the silicon substrate 20 (i.e., a single crystal silicon substrate) as a result of rearrangement of silicon atoms on the surface of the substrate. In addition, an insulating film including the crystalline oxide film 22 made of crystalline silicon dioxide (i.e., the crystalline oxide 21) that has grown epitaxially over the steps 20a is also formed over the steps 20a. Accordingly, crystal lattice continuity is maintained in the interface between the silicon substrate 20 and crystalline oxide film 22, and no great strain is created in the vicinity of the interface, during the formation of the insulating film. Thus, almost no structural defects are developed within the silicon substrate 20. Therefore, in the MOSFET with the MOS heterostructure according to the second embodiment, the interface states, which cause the dielectric breakdown of the crystalline oxide film 22 to be the lower layer of the gate insulating film and/or decrease the mobility of carriers in the channel 25, can be substantially eliminated from the silicon substrate 20. As a result, the performance of the transistor can be enhanced and the operating speed thereof can be increased.

In addition, in the MOS heterostructure according to the second embodiment, the crystalline oxide film 22 is linked two-dimensionally over the silicon substrate 20. Thus, no structural transition layer of suboxide is formed in a region of the insulating film, including the crystalline oxide film 22, in the vicinity of the interface between the oxide film 22 and the silicon substrate 20. Therefore, in the MOSFET with the MOS heterostructure of the second embodiment, chemical bonds in that region of the crystalline oxide film 22, i.e., the lower part of the gate insulating film, near the interface between the film 22 and silicon substrate 20 are not broken by hot electrons. In addition, the decrease in band gap of the gate insulating film due to bending can also be avoided, thus increasing the breakdown voltage and reliability of the gate insulating film.

Furthermore, in the MOS heterostructure according to the second embodiment, the tantalum oxide film 23 with a relative dielectric constant higher than that of the crystalline oxide film 22 is deposited on the crystalline oxide film 22. And an insulating film, consisting of the crystalline oxide film 22 and tantalum oxide film 23, is formed over the silicon substrate 20. Thus, even if the crystalline oxide film 22 is thinned, the leakage current flowing from the silicon substrate 20 can still be reduced substantially without increasing the thickness of the insulating film.

In the MOS heterostructure according to the second embodiment, the tantalum oxide film 23 is deposited on the crystalline oxide film 22. Alternatively, any other dielectric film may be deposited instead so long as the relative dielectric constant of the dielectric film is higher than that of a silicon dioxide film.

Embodiment 3

Hereinafter, MOS heterostructure, semiconductor device with the structure and method for fabricating the device according to a third embodiment of the present invention will be described with reference to the accompanying drawings. A semiconductor device with an MOS heterostructure according to the third embodiment includes nonvolatile memory cells formed by using a single crystal silicon substrate.

FIGS. 7(a) through 7(f) are cross-sectional views illustrating respective process steps for fabricating a semiconductor device with an MOS heterostructure according to the third embodiment.

Figure 7A:
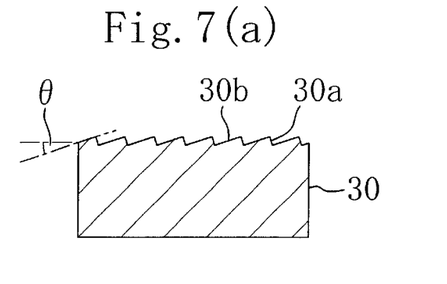
FIGS. 7(a) through 7(f) are cross-sectional views illustrating respective process steps for fabricating a semiconductor device with an MOS heterostructure according to a third embodiment of the present invention.

First, as shown in FIG. 7(a), a (001) clean surface is prepared by heating and cleaning a (001) crystallographic plane of a single crystal silicon substrate 30 (hereinafter, simply referred to as a "silicon substrate 30") within vacuum or by homoepitaxy of silicon.

Specifically, the silicon substrate 30 is a misorientation substrate, and a misorientation angle θ defined between the principal surface thereof and the (001) planes may be 5 degrees, for example. If the surface of the silicon substrate 30, which is a misorientation substrate, is treated by the heat cleaning within vacuum or by the homoepitaxy of silicon, then silicon atoms are going to be rearranged on the outermost cleaned surface of the silicon substrate 30 as in the first and second embodiments. As a result, a plurality of steps 30a and terraces 30b are formed on the surface of the silicon substrate 30 as shown in FIG. 7(a).

Figure 7B:
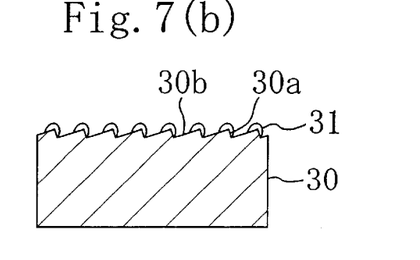

Next, the surface of the silicon substrate 30 with the Si(001)–2×1 topology is thermally oxidized. Specifically, the silicon substrate 30 is heated up to about 750° C. within dried oxygen ambient in an electric furnace. In such a case, a crystalline oxide 31, more specifically, crystalline silicon dioxide, grows epitaxially over the steps 30a with a height approximately equal to the thickness of two atomic layers during the initial stage of the thermal oxidation as shown in FIG. 7(b). The crystalline oxide 31 has a crystal structure corresponding to that of the steps 30a. On the other hand, the crystalline oxide 31 does not grow epitaxially out of the terraces 30b themselves. However, the crystalline oxide 31, which has been formed over the steps 30a, further grows epitaxially along the respective surfaces of the terraces 30b. As a result, part of each terrace 30b (i.e., both the higher- and lower terraces 30b alike) in the vicinity of the nearest step 30a is also covered with the crystalline oxide 31.

Figure 7C:
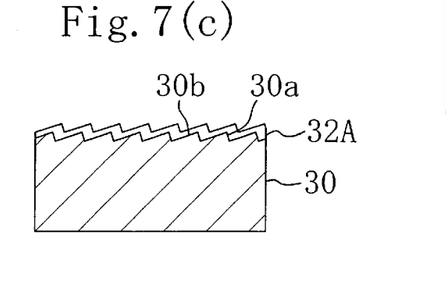

If the misorientation angle θ is 5 degrees as in this embodiment, then the step gap is about 3 nm. Accordingly, as the thermal oxidation advances, the crystalline oxides 31 formed on an adjacent pair of steps 30a are linked together, thereby forming a two-dimensionally-linked crystalline oxide film 32A over the silicon substrate 30 to a thickness of about 1 to about 2 nm as shown in FIG. 7(c). In this case, the thickness of the crystalline oxide film 32A is determined depending on the temperature of the substrate or the partial pressure of oxygen during the epitaxy. However, the crystalline oxide film 32A can grow to a thickness of at most about 3 to about 4 nm.

Figure 7D:
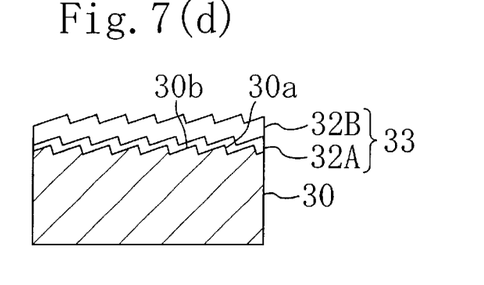
Figure 7E:
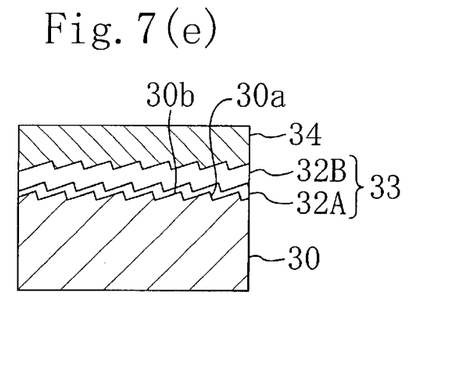

According to the third embodiment, after the crystalline oxide film 32A has been formed, the thermal oxidation is continued, thereby forming an amorphous silicon dioxide layer, i.e., an amorphous oxide film 32B, to be about 4 nm thick on the crystalline oxide film 32A as shown in FIG. 7(d). As a result, a tunnel oxide film 33 with a two-layer structure, consisting of the crystalline oxide film 32A and amorphous oxide film 32B, is formed to a thickness of about 7 nm as a first gate insulating film.

According to this embodiment, even if the conditions for the thermal oxidation are kept constant, the phase of the tunnel oxide film 33 changes by itself from a crystalline one (i.e., the crystalline oxide film 32A as the lower layer) into an amorphous one (i.e., the amorphous oxide film 32B as the upper layer) as the strain is relaxed. Even in such a case, however, crystal lattice continuity is still maintained in the interface between the silicon substrate 30 and tunnel oxide film 33. Thus, the energy band structure such as that shown in FIG. 3(b) is realized in the vicinity of the interface, and is not affected seriously by the amorphous oxide film 32B formed on the crystalline oxide film 32A. Also, the silicon substrate 30 is affected to a lesser degree by the expansion of the tunnel oxide film 33, which has been formed by the thermal oxidation to include the crystalline oxide and amorphous oxide films 32A and 32B, compared to forming a tunnel oxide film by ordinary thermal oxidation.

Figure 7F:
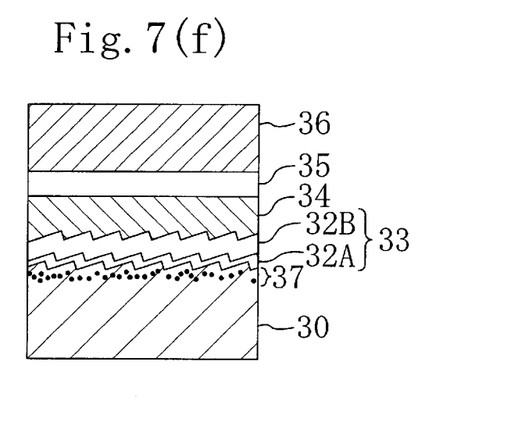

Subsequently, the tunnel oxide film 33 is annealed within dried nitrogen ambient to remove oxide defects such as pinholes. Then, a floating-gate-prototype conductive film, a second-gate-insulating-film-prototype oxide film and a control-gate-prototype conductive film (none of which is shown) are formed in this order on the tunnel oxide film 33. The second-gate-insulating-film-prototype oxide film is formed by ordinary thermal oxidation. Then, the floating-gate-prototype conductive film and tunnel oxide film 33 are etched in this order using a resist pattern (not shown), which has been defined to cover respective regions of the conductive film where the floating gates are to be formed. In this manner, a floating gate 34 is formed over the silicon substrate 30 with the first gate insulating film, or the tunnel oxide film 33, interposed therebetween. Subsequently, the control-gate-prototype conductive film and second-gate-insulating-film-prototype oxide film are etched in this order, thereby forming a control gate 36, which is capacitively coupled to the floating gate 34, over the floating gate 34 with a second gate insulating film 35 interposed therebetween as shown in FIG. 7(f). Thereafter, the same process steps as those of an ordinary nonvolatile memory cell fabrication process are performed to complete a semiconductor device. In this case, if a predetermined voltage is applied to the vicinity of the interface of the MOS heterostructure, i.e., between the silicon substrate 30 and floating gate 34, then a channel 37 is formed in a region of the silicon substrate 30 in the vicinity of the interface between the tunnel oxide film 33, i.e., the first gate insulating film, and the substrate 30 as shown in FIG. 7(f).

Figure 8:
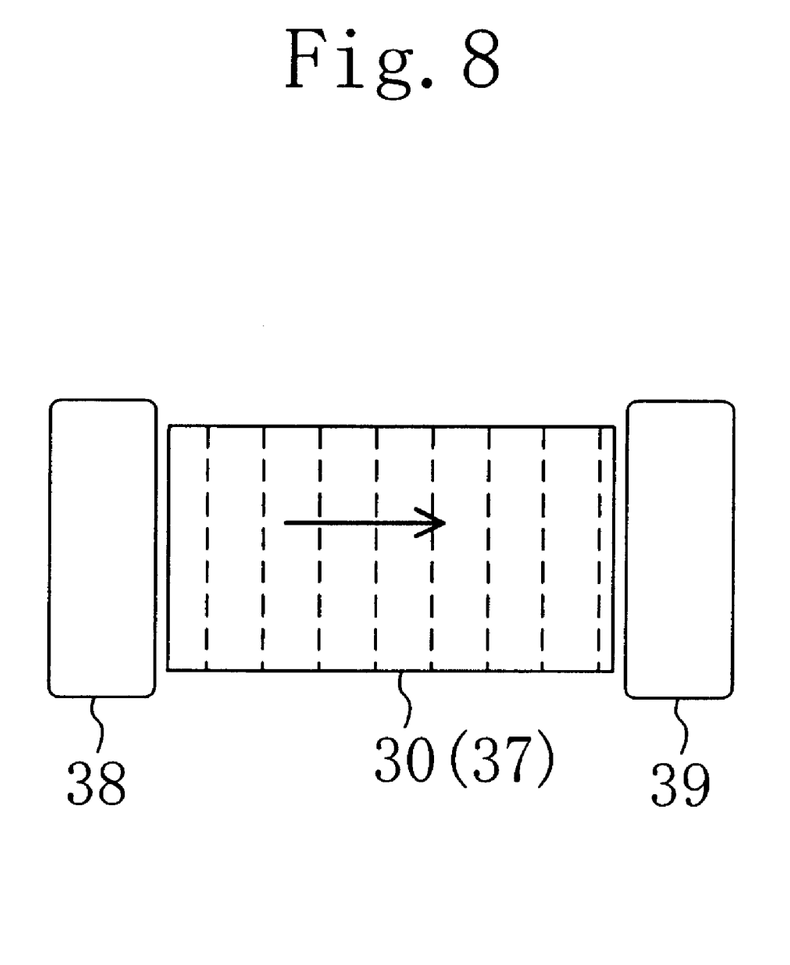
FIG. 8 is a plan view of the semiconductor device with the MOS heterostructure according to the third embodiment.

FIG. 8 illustrates a planar layout of a semiconductor device with the MOS heterostructure, more specifically a nonvolatile memory cell, according to the third embodiment. In FIG. 8, the illustration of the tunnel oxide film 33, floating gate 34, second gate insulating film 35 and control gate 36 is omitted. The floating gate 34 and control gate 36 are formed to overlap with an active region of the transistor. Also, the broken lines shown in FIG. 8 indicate the direction in which the steps 30a formed over the surface of the silicon substrate 30 extend. In other words, a region interposed between a pair of adjacent broken lines in FIG. 8 corresponds to a terrace 30b on the surface of the silicon substrate 30. It should be noted that the shapes of the steps 30a and terraces 30b remain the same even after the tunnel oxide film 33 has been formed.

As shown in FIG. 8, source/drain regions 38 and 39 are defined at such regions within the silicon substrate 30 that the steps 30a extend vertically to the channel longitudinal direction. And these regions have been doped with a dopant. Accordingly, carriers (i.e., electrons) in the channel 37 travel from the source toward drain regions 38 to 39 (i.e., in the direction indicated by the arrow in FIG. 8) while crossing the steps 30a. Thus, hot electrons, which have been generated in the vicinity of the steps 30a, can be injected into the floating gate 34 more efficiently. In this case, the greater the misorientation angle θ (i.e., as the height of the steps 30a increases), the more efficiently the hot electrons are injected.

In the MOS heterostructure according to the third embodiment, the steps 30a and terraces 30b are formed on the surface of the silicon substrate 30 (i.e., a single crystal silicon substrate) as a result of rearrangement of silicon atoms on the surface of the substrate. In addition, an insulating film including the crystalline oxide film 32A made of crystalline silicon dioxide (i.e., the crystalline oxide 31) that has grown epitaxially over the steps 30a is also formed as the tunnel oxide film 33 over the steps 30a. Accordingly, crystal lattice continuity is maintained in the interface between the silicon substrate 30 and crystalline oxide film 32A, and no great strain is created in the vicinity of the interface, during the formation of the insulating film. Thus, almost no structural defects are developed within the silicon substrate 30. Therefore, in the nonvolatile memory cell with the MOS heterostructure according to the third embodiment, the interface states, which cause the dielectric breakdown of the tunnel oxide film 33 to be the first gate insulating film and/or decrease the mobility of carriers in the channel 37, can be substantially eliminated from the silicon substrate 30. As a result, the reliability of the nonvolatile memory cell can be increased and the nonvolatile memory cell can perform read and write operations a much greater number of times.

In addition, in the MOS heterostructure according to the third embodiment, the crystalline oxide film 32A is linked two-dimensionally over the silicon substrate 30. Thus, no structural transition layer of suboxide is formed in a region of the crystalline oxide film 32A, i.e., the lower layer of the tunnel oxide film 33, in the vicinity of the interface between the film 32A and substrate 30. Therefore, in a nonvolatile memory cell with the MOS heterostructure of the third embodiment, chemical bonds in that region of the tunnel oxide film 33, i.e., the first gate insulating film, near the interface between the film 33 and substrate 30 are not broken by hot electrons. In addition, the decrease in band gap of the first gate insulating film due to bending can also be avoided, thus increasing the breakdown voltage and reliability of the first gate insulating film.

In the nonvolatile memory cell with the MOS heterostructure according to the third embodiment, the steps 30a are supposed to extend vertically to the channel longitudinal direction. Alternatively, the steps 30a may extend to cross the channel longitudinal direction substantially at right angles.

Also, in the Mos heterostructure according to the foregoing embodiments, a silicon substrate is supposed to have a (001) crystallographic plane as the principal surface thereof. Alternatively, a silicon substrate with any other crystallographic plane orientation may also be used. In particular, if a silicon substrate having a (111) plane on its principal surface is used, then a plurality of steps and terraces can be formed on the surface thereof by wet cleaning using an alkaline solution without performing heat cleaning within ultra high vacuum. In addition, the respective upper surfaces of the terraces can be smooth at an atomic level.

What is claimed is:

1. An MOS heterostructure comprising: a single crystal silicon substrate with a misorientation angle; insulating film formed on the substrate; and a conductive film formed on the insulating film, wherein the substrate comprises a plurality of terraces and steps, which have been formed as a result of rearrangement of silicon atoms on the surface of the substrate, each said step being located in a boundary between an adjacent pair of the terraces, and wherein the insulating film includes a two-dimensionally-linked crystal film composed of crystalline silicon dioxide that has grown epitaxially over the steps, and a dielectric film formed on the crystal film.

2. The MOS heterostructure of claim 1, wherein the dielectric film is made of an amorphous silicon dioxide.

3. The MOS heterostructure of claim 1, wherein a relative dielectric constant of the dielectric film is higher than that of a silicon dioxide film.

4. The MOS heterostructure of claim 1, wherein the crystalline silicon dioxide further grows epitaxially along the respective surfaces of the terraces to form the crystal film.

* * * * *